United States Patent [19]

Edwards, Jr.

[11] 4,353,026
[45] Oct. 5, 1982

[54] SHORT CHASER WITH RELAY OPERATED INDICATOR FOR LOCATING AND INDICATING THE CLEARANCE OF SHORT CIRCUITS

[76] Inventor: Harry J. Edwards, Jr., 1009 Baldwin Rd., Richmond, Va. 23229

[21] Appl. No.: 120,774

[22] Filed: Feb. 12, 1980

[51] Int. Cl.³ .................... G01R 31/02; G01R 31/08
[52] U.S. Cl. ......................................... 324/51; 324/52
[58] Field of Search ...:............................ 324/51, 52; 340/649–651; 361/42, 170

[56] References Cited

U.S. PATENT DOCUMENTS

| 396,582 | 1/1889 | Loomis | 324/51 |
|---|---|---|---|
| 2,186,212 | 1/1940 | Scoggin | 324/51 |
| 2,207,202 | 7/1940 | LaDeau | 340/649 X |
| 3,742,345 | 6/1973 | Lacey | 324/52 |
| 3,809,961 | 5/1974 | Kershaw | 324/51 |

FOREIGN PATENT DOCUMENTS 233431  5/1925  United Kingdom .................. 324/51

Primary Examiner—Gerard R. Strecker
Attorney, Agent, or Firm—Griffin, Branigan & Butler

[57] ABSTRACT

The Short Chaser is a diagnostic tool for use by electricians in locating and clearing short circuits in building wiring systems. Its value to the tradesman lies in its ability to audibly indicate the clearing of the short at the moment that the corrective action is taken, thereby pinpointing where the problem was. This enables one man working by himself to handle trouble calls involving shorted branch circuit wiring, for the Short Chaser watches the circuit and sounds off when the right move is made. Because of its design, it is suitable for use on circuits sustaining shorts across circuit conductors or shorts from hot to ground. Therefore, the nature of the short is not pertinent to the successful operation of the device.

5 Claims, 1 Drawing Figure

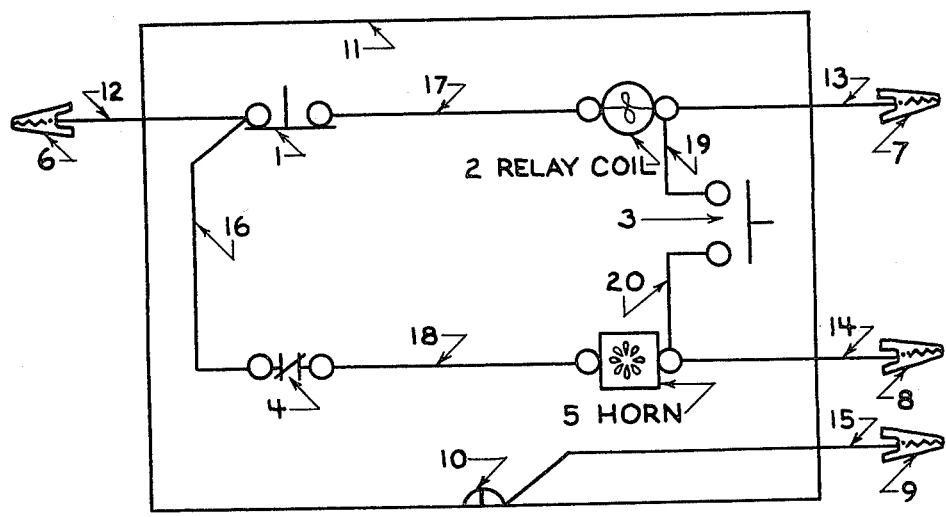

SHORT CHASER WITH RELAY OPERATED INDICATOR FOR LOCATING AND INDICATING THE CLEARANCE OF SHORT CIRCUITS

BRIEF SUMMARY OF THE INVENTION

Diagnostic efforts in electrical work within buildings can be difficult. As an example, the location of short circuits in building wiring cannot be found unless the shorted circuit is properly monitored during the search process for determination of when the short is cleared. Because the nature of the short is not known, continuous surveillance is required to reveal when the correct action is taken. Immediate annunciation is important to the diagnostic technician so he can be advised that his action just taken resulted in clearing the short from the circuit. This tells him where the short was, and leads to proper diagnosis and corrective action.

No known device today allows one man to conduct the search and correct process. The Short Chaser is connected back at the power panel to observe the condition of the circuit, and to remain silent until the moment the short is cleared. Then, it reacts audibly, permitting the technician at his remote location within earshot to hear the Short Chaser sounding off. It is particularly effective within residences.

BRIEF DESCRIPTION OF THE DRAWINGS

The FIGURE shows a circuit diagram of the invention.

DESCRIPTION OF THE INVENTION

Referring to the FIGURE, the invention is designed to be connected into the power panel. Alligator Clip 6 at the end of black wire 12 is connected to the shorted circuit's overcurrent protective device (fuse terminal or breaker terminal), after the shorted circuit's wire is removed from the terminal. Alligator clip 7 at the end of red wire 13 is connected to the shorted circuit's wire. Alligator clip 8 at the end of white wire 14 is connected to neutral in the power panel, and alligator clip 9 at the end of green wire 15 is connected to ground in the power panel. Connection of alligator clip 9 merely insures personnel safety by grounding the casing of the Short Chaser. 10 is a grounding screw. 11 is the case. Once the connections are made into the panel as described above, the circuit protective device is reset, if a circuit breaker is involved, or replaced, if a fuse is involved. This energizes the Short Chaser and places it in a supervisory position, with respect to the circuit sustaining the short. Supervisory current flow now exists from alligator clip 6 over black wire 12 through normally-closed momentary push button 1 over wire 17 through relay coil 2 to red wire 13 and on to alligator clip 7. This causes the relay coil 2 to operate the mechanism of the relay to open normally-closed relay contact 4, preventing current flow to horn 5. Therefore, the horn is silent. To test the operation of horn 5 before diagnostic checking is begun, normally-closed momentary push button 1 is depressed momentarily, opening the circuit path to relay coil 2, where upon the relay coil 2 is de-energized and its normally-closed relay contact 4 closes to establish a circuit path over wire 16 through normally closed contact 4 over wire 18 to horn 5 over white wire 14 to alligator clip 8. The horn now blows, indicating good operating condition. Releasing normally-closed momentary push button 1 re-establishes the circuit as before, to energize relay coil 2, and the horn is once again silent. If, upon connection of the Short Chaser into the panel as first described the short circuit current is insufficient to satisfactorily energize relay coil 2, normally-open momentary push button 3 is momentarily depressed to provide a higher capacity circuit path from relay coil 2 over wire 19 through normally-open momentary push button 3 (now closed) over wire 20 and white wire 14 to alligator clip 8, allowing satisfactory inrush current to pass to satisfactorily energize relay coil 2 so as to pick up the mechanism of the relay. Once "pulled in", relay coil 2 can continue to "hold in" through the path created by the short circuit, so normally-open momentary push button 3 is released, causing the substantially smaller supervisory current flow required to hold in relay coil 2 to pass over red wire 13 to alligator clip 7. Once the short is cleared, no path exists over red wire 13 and alligator clip 7, so relay coil 2 is de-energized, and its normally-closed relay contact 4 closes to establish a circuit path for current flow from alligator clip 16 over black wire 12 and wire 16 through normally-closed relay contact 4 and wire 18 to horn 5 over white wire 14 to alligator clip 8. Therefore, the horn blows, indicating clearing of the short circuit has occurred.

When the circuit was short, a path for current flow existed in the shorted circuit, obvious because as long as the wire of the shorted circuit was connected to the terminal of the overcurrent protective device, the fuse would blow or the breaker would trip. So once the Short Chaser is connected as first described, and a new fuse installed or the breaker reset, current flows from alligator clip 6 through black wire 12 through normally-closed momentary push button 1 through wire 17 through relay coil 2 through red wire 13 and alligator clip 7. This serves to energize relay coil 2, causing normally-closed relay contact 4 to open. Opening of relay contact 4 prevents current flow over wires 16 and 18, so horn 5 does not blow. If the magnitude of the short circuit is insufficient to energize relay coil 2, as might be the case when the shorted circuit in question is served by a ground fault interrupter, normally-open momentary push button 3 is momentarily depressed to establish a circuit path through wires 19 and 20, momentary push button 3, white wire 14 and alligator clip 8 to neutral, permitting enough inrush current to pass to energize relay coil 2. Since holding current of a relay coil is significantly lower than inrush current, relay coil 2 will hold in once normally-open momentary push button 3 is released by virtue of the circuit path previously described for the coil through alligator clip 7 connected to the wire of the shorted circuit.

For verifying good operating condition of horn 5, normally-closed momentary push button 1 is depressed, and the circuit path to relay coil 2 is interrupted, whereupon normally-closed relay contact 4 closes. When this happens, current flows from alligator clip 6 connected to the hot terminal of the overcurrent protective device over black wire 12, wire 16, normally-closed relay contact 4, wire 18, through horn 5, over white wire 14 to alligator clip 8 to neutral, causing the horn to blow. Releasing normally-closed momentary push button 1 allows it to reclose and complete the circuit path back to relay coil 2, whereupon the relay coil 2 energizes and reopens normally-closed relay contact 4, silencing the horn.

While the technician directs his activities toward locating the point of the short circuit, the Short Chaser monitors the circuit, keeping silent as long as the short persists. When the circuit path for short circuit current flow is cleared, current can no longer flow over wire 17, through relay coil 2, over red wire 13 and alligator clip 7, because the previously short circuit wire no longer offers a path through the short. Relay coil 2 is de-energized, and normally-closed relay contact 4 closes, allowing the horn to blow as previously described. The technician returns to the power panel, removes the fuse or turns off the breaker, and disconnects the Short Chaser. After the Short Chaser is disconnected, the circuit wire is reconnected to the circuit overcurrent protective device for normal operation of the circuit.

I claim:

1. A short circuit monitoring and locating apparatus for use in locating and clearing short circuits in wiring circuits between a high potential terminal and a low potential terminal, said apparatus comprising:

a casing;

first conductor means adapted for connection to said high potential terminal;

second conductor means adapted for connection to a first wire of the shorted circuit which has been decoupled from said high potential terminal;

third conductor means adapted for connection to the low potential terminal of said wiring circuits;

relay means having a relay coil means and relay contact means, said relay coil means being connected in series between said first and second conductor means for conducting current therebetween and said contact means being connected between said first and third conductors for changing between normal and energized states, one state being open and the other closed, in response to a current in said relay coil means;

audible indicating means, said contact means of said relay means and said audible indicating means being connected in series between said first and third conductor means; whereby when said connections are established to the high potential terminal, to said shorted circuit first wire and to said low-potential terminal, a circuit path is established through the first conductor means, the relay coil means and the second conductor means by the short circuit and over which path sufficient current flows to energize said relay coil means and change the state of said relay contact means, thereby changing the state of current flow to said audible indicating means, with said new state of current flow being maintained so long as the short circuit remains, and when the short circuit is cleared, said relay coil means becomes deenergized causing said relay contact means to return to their normal state, thus again changing the state of current flow to said audible indicatior means to indicate clearing of said short circuit; and, a normally open switch means connected between said second and third connector means for closing a momentary circuit path through said relay coil means and said second and third conductor means, to energize said relay coil means and thereby change said relay contact means to said energized state when the short circuit current is insufficient to energize said relay coil means to change said relay contact means to said energized state, but is sufficient to maintain the relay contact means in said energized state.

2. The apparatus of claim 1 further including normally closed switch means connected in series between said first and said second conductor means for momentarily opening said circuit path through said first conductor means, said relay coil means and said second conductor means to momentarily test said audible indicating means by simulating the clearing of said short circuit.

3. The apparatus of claim 2 further including fourth conductor means electrically connected to said case and adapted for connection to ground.

4. The apparatus of claim 1 further including fourth conductor means electrically connected to said case and adapted for connection to ground.

5. The apparatus of claim 1 wherein said normal state of said relay contact means is closed and the energized state is open.

* * * * *